United States Patent
Kula et al.

(10) Patent No.: US 9,876,053 B2
(45) Date of Patent: Jan. 23, 2018

(54) SEMICONDUCTOR DEVICES COMPRISING MAGNETIC MEMORY CELLS AND METHODS OF FABRICATION

(71) Applicant: Micron Technology, Inc., Boise, ID (US)

(72) Inventors: Witold Kula, Gilroy, CA (US); Wayne I. Kinney, Emmett, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/289,610

(22) Filed: Oct. 10, 2016

(65) Prior Publication Data

US 2017/0033155 A1 Feb. 2, 2017

Related U.S. Application Data

(63) Continuation of application No. 13/948,839, filed on Jul. 23, 2013, now Pat. No. 9,466,787.

(51) Int. Cl.
*H01L 27/22* (2006.01)
*H01L 43/12* (2006.01)
(Continued)

(52) U.S. Cl.
CPC .......... *H01L 27/222* (2013.01); *G11C 11/161* (2013.01); *H01L 43/02* (2013.01);
(Continued)

(58) Field of Classification Search
None
See application file for complete search history.

(56) References Cited

U.S. PATENT DOCUMENTS 4,882,936 A 11/1989 Garshelis
5,768,069 A 6/1998 Mauri
(Continued)

FOREIGN PATENT DOCUMENTS

EP 1353443 A2 10/2003
EP 2385548 A1 11/2011
(Continued)

OTHER PUBLICATIONS

You et al., Spin Transfer Torque and Tunneling Magnetoresistance Dependences on Finite Bias Voltages and Insulator Barrier Energy, Thin Solid Films, vol. 519, (2011), pp. 8247-8251.
(Continued)

*Primary Examiner* — Michelle Mandala
(74) *Attorney, Agent, or Firm* — TraskBritt

(57) ABSTRACT

A magnetic cell core includes a seed region with a plurality of magnetic regions and a plurality of nonmagnetic regions thereover. The seed region provides a template that enables formation of an overlying nonmagnetic region with a microstructure that enables formation of an overlying free region with a desired crystal structure. The free region is disposed between two nonmagnetic regions, which may both be configured to induce surface/interface magnetic anisotropy. The structure is therefore configured to have a high magnetic anisotropy strength, a high energy barrier ratio, high tunnel magnetoresistance, a low programming current, low cell-to-cell electrical resistance variation, and low cell-to-cell variation in magnetic properties. Methods of fabrication, memory arrays, memory systems, and electronic systems are also disclosed.

20 Claims, 9 Drawing Sheets

(51) Int. Cl.
*H01L 43/08* (2006.01)
*G11C 11/16* (2006.01)
*H01L 43/02* (2006.01)
*H01L 43/10* (2006.01)

(52) U.S. Cl.
CPC .............. *H01L 43/08* (2013.01); *H01L 43/10* (2013.01); *H01L 43/12* (2013.01); *H01L 27/228* (2013.01)

(56) References Cited

U.S. PATENT DOCUMENTS

| | | |
|---|---|---|
| 6,166,948 A | 12/2000 | Parkin et al. |
| 6,258,470 B1 | 7/2001 | Sakakima et al. |
| 6,275,363 B1 | 8/2001 | Gill |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,611,405 B1 | 8/2003 | Inomata et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,083,988 B2 | 8/2006 | Deak |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,481,181 B2 | 7/2013 | Wang et al. |
| 8,492,169 B2 | 7/2013 | Cao et al. |
| 8,570,798 B2 | 10/2013 | Meade et al. |
| 8,587,043 B2 | 11/2013 | Natori et al. |
| 8,623,452 B2 | 1/2014 | Zhou |
| 8,749,003 B2 | 6/2014 | Horng et al. |
| 8,760,818 B1 | 6/2014 | Diao |
| 8,779,538 B2 | 7/2014 | Chen et al. |
| 8,803,265 B2 | 8/2014 | Lim et al. |
| 8,823,118 B2 | 9/2014 | Horng et al. |
| 2002/0089874 A1 | 7/2002 | Nickel et al. |
| 2002/0105827 A1 | 8/2002 | Redon et al. |
| 2003/0011939 A1 | 1/2003 | Gill |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0075959 A1 | 4/2004 | Gill |
| 2004/0091744 A1 | 5/2004 | Carey et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2006/0038213 A1 | 2/2006 | Mori et al. |
| 2006/0042930 A1 | 3/2006 | Mauri |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0179699 A1 | 7/2008 | Horng et al. |
| 2008/0205130 A1 | 8/2008 | Sun et al. |
| 2008/0225581 A1 | 9/2008 | Yamane et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0190262 A1 | 7/2009 | Murakami et al. |
| 2009/0229111 A1 | 9/2009 | Zhao et al. |
| 2009/0257151 A1 | 10/2009 | Zhang et al. |
| 2010/0034014 A1 | 2/2010 | Ohno et al. |
| 2010/0080036 A1 | 4/2010 | Liu et al. |
| 2010/0080048 A1 | 4/2010 | Liu et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0230769 A1 | 9/2010 | Ozaki et al. |
| 2010/0240151 A1 | 9/2010 | Belen et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0096443 A1 | 4/2011 | Zhang et al. |
| 2011/0121366 A1 | 5/2011 | Or-Bach et al. |
| 2011/0145514 A1 | 6/2011 | Lee et al. |

(56) References Cited

U.S. PATENT DOCUMENTS

| | | |
|---|---|---|
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0170339 A1 | 7/2011 | Wunderlich et al. |
| 2011/0170341 A1 | 7/2011 | Butler |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0040207 A1 | 2/2012 | Horng et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0140658 A1 | 6/2013 | Yumane et al. |
| 2013/0146996 A1 | 6/2013 | Yu et al. |
| 2013/0228884 A1 | 9/2013 | Zheng et al. |
| 2013/0229866 A1 | 9/2013 | Ranjan et al. |
| 2013/0250661 A1 | 9/2013 | Sandhu et al. |
| 2013/0313665 A1 | 11/2013 | Rhie et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0027869 A1 | 1/2014 | Lee et al. |
| 2014/0099735 A1 | 4/2014 | Horng et al. |
| 2014/0169088 A1* | 6/2014 | Buhrman ............... G11C 11/18 365/158 |
| 2014/0175574 A1* | 6/2014 | Watts ..................... H01L 29/82 257/421 |
| 2015/0028439 A1 | 1/2015 | Kula et al. |

FOREIGN PATENT DOCUMENTS

| | | |
|---|---|---|
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2009194366 A | 8/2009 |
| KR | 1020040092342 A | 11/2004 |
| KR | 1020070094431 A | 9/2007 |
| KR | 1020080029852 A | 4/2008 |
| KR | 1020120008295 A | 1/2012 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012128891 A1 | 9/2012 |
| WO | 2012160937 A1 | 11/2012 |

OTHER PUBLICATIONS

Yu et al., 1/f Noise in MgO Double-Barrier Magnetic Tunnel Junctions, Applied Physics Letters, vol. 98, (2011), pp. 112504-1-112504-3.

Zhang, Anisotropic Magnetomechanical Effect in Tb0.3Dy0.7Fe2 Alloy, Journal of Magnetism and Magnetic Materials, vol. 324, (2012), pp. 190-195.

Zhu et al., Magnetic Tunnel Junctions, MaterialsToday, vol. 9, No. 11, (Nov. 2006), pp. 36-45.

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

Auwarter et al., Co on h-BN/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.

Chen et al., Advances and Future Prospects of Spin-Transfer Torque Random Access Memory, IEEE Transactions on Magnetics, vol. 26, No. 6, (Jun. 2010), pp. 1873-1878.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), (abstract only), 2 pages.

Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 14, No. 19, (2005), pp. L587-L589.

Heczko et al., Strain and Concurrent Magnetization Changes in Magnetic Shape Memory Ni—Mn—Ga Single crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

(56) References Cited

OTHER PUBLICATIONS

Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
Ke et al., Oxygen-Vacancy-Induced Diffusive Scatting in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), abstract, 1 page.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara et al., Tunnel Magnetoresistance Above 170% and Resistance-Area Product of 1 O (μm)2 Attained by In Situ Annealing of Ultra-Thin MgO Tunnel Barrier, Applied Physics Express, vol. 4, (2011), 2 pages, (abstract only).
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Miracle et al., An Assessment of Binary Metallic Glasses: Correlations Between Structure, Glass Forming Ability and Stability (Preprint), Air Force Research Laboratory, (2011), 97 pages.
Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.
Moroz et al., Modeling the Impact of Stress on Silicon Processes and Devices, Materials Science in Semiconductor Processing, vol. 6, (2003), pp. 27-36.
Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.
Nishitani et al., Magnetic Anisotropy in a Ferromagnetic (Ga,Mn)Sb Thin Film, Physica E, vol. 42, (2010), pp. 2681-2684.
Piramanayagam, S. N., Perpendicular Recording Media for Hard Disk Drives, Journal of Applied Physics, vol. 102, (2007), pp. 011301-1-011301-22.
Resnik et al., Mechanical Stress in Thin Film Microstructures on Silicon Substrate, Vacuum, vol. 80, (2005), pp. 236-240.
Rodmacq et al., Influence of Thermal Annealing on the Perpendicuular Magnetic Anisotropy of Pt/Co/AlOx Trilayers, Physical Review B, vol. 79, (2009), pp. 024423-1-024423-8.
Sandhu et al., Memory Cells, Semiconductor Structures, Semiconductor Devices, and Methods of Fabrication, U.S. Appl. No. 14/249,183, (filed Apr. 9, 2014).
Sandhu et al., Memory Cells, Methods of Fabrication, Semiconductor Devices, Memory Systems, and Electronic Systems, U.S. Appl. No. 14/026,627, (filed Sep. 13, 2013).
Sato et al., Perpendicular-Anisotropy CoFeB-MgO Magnetic Tunnel Junctions with a MgO/CoFeB/Ta/CoFeB/MgO Recording Structure, Applied Physics Letters, vol. 101, (2012), pp. 022414-1-022414-4.
Siddik et al., Memory Cells, Methods of Fabrication, and Semiconductor Devices, U.S. Appl. No. 14/030,763, (filed Sep. 18, 2013).
Siddik et al., Memory Cells, Methods of Fabrication, and Semiconductor Devices, U.S. Appl. No. 14/193,979, (filed Feb. 28, 2014).
Stone et al., Tuning of Ferromagnetism Through Anion Substitution in Ga—Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Vitos et al., The Surface Energy of Metals, Surface Science, vol. 411, (1998), pp. 186-202.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wilson et al., New Materials for Micro-Scale Sensors and Actuators: An Engineering Review, Materials Science and Engineering R, vol. 56, (2007), pp. 1-129.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.
Wu et al., Tuning Magnetic Anisotropies of Fe Films on Si(111) Substrate Via Direction Variation of Heating Current, Scientific Reports, vol. 3, (Mar. 26, 2013), pp. 1-5.

\* cited by examiner

SEMICONDUCTOR DEVICES COMPRISING MAGNETIC MEMORY CELLS AND METHODS OF FABRICATION

CROSS-REFERENCE TO RELATED APPLICATION

This application is a continuation of U.S. patent application Ser. No. 13/948,839, filed Jul. 23, 2013, now U.S. Pat. No. 9,466,787, issued Oct. 11, 2016 the disclosure of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region between. The free region and the fixed region may exhibit magnetic orientations that are either horizontally oriented ("in-plane") or perpendicularly oriented ("out-of-plane") with the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density (Jr) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

A magnetic region's magnetic anisotropy ("MA") is an indication of the directional dependence of the material's magnetic properties. Therefore, the MA is also an indication of the strength of the material's magnetic orientation and of its resistance to alteration of the magnetic orientation. A magnetic material exhibiting a magnetic orientation with a high MA strength may be less prone to alteration of its magnetic orientation than a magnetic material exhibiting a magnetic orientation with a lower MA strength. In case of free regions with comparable total magnetic moments, the amount of programming current required to switch the free region from the parallel configuration to the anti-parallel configuration is affected by MA strength in that a free region with a stronger (i.e., a higher) MA strength may require a greater amount of programming current to switch the magnetic orientation thereof than a free region with a weaker (i.e., a lower) MA strength. However, a free region with a weak MA strength is also often less stable during storage such that it may be prone to premature alteration out of its programmed configuration (i.e., the programmed parallel or anti-parallel configuration).

A magnetic material's MA strength may be impacted by interaction (e.g., contact) between the magnetic material and a neighboring nonmagnetic material (e.g., an oxide material). Contact may induce MA (e.g., increase MA strength) along the interface between the magnetic material and the nonmagnetic material, adding to the overall MA strength of the magnetic material and the MRAM cell. Generally, the greater the ratio of the magnetic material in contact with the surface/interface MA-inducing material to the non-contacted portion of the magnetic material, the higher the MA strength of the magnetic region.

Often, design and fabrication of MRAM cells involves a tradeoff between achieving high MA strength in the free region and other often-desirable characteristics of the cell. For example, a thin (i.e., short height) free region, adjacent to an MA-inducing material, may have a high ratio of contact-to-non-contacted portions and, therefore, high MA strength. However, a thin free region may have a low "energy barrier ratio" (Eb/kT, wherein, Eb represents the cell's energy barrier, k is the Boltzmann constant, and T is the temperature of the cell), compared to a thick free region. The Eb and energy barrier ratio are indications of the cell's thermal stability and, therefore, its data retention. The lower the Eb and the lower the energy barrier ratio, the more prone the cell may be to premature switching. A thin free region may also have low tunnel magnetoresistance ("TMR"). TMR is a ratio of the difference between the cell's electrical resistance in the anti-parallel stage ($R_{ap}$) and its resistance in the parallel stage ($R_p$) to $R_P$ (i.e., TMR=$(R_{ap}-R_p)/R_p$). Low TMR may lower a cell's read-out signal and may slow the reading of the MRAM cell during operation. Low TMR may also necessitate use of high programming current. Thus, there is often a tradeoff between, on the one hand, forming a free region to be thin so as to achieve a high MA strength and, on the other hand, forming the free region to be thick so as to achieve a high Eb, high energy barrier ratio, high thermal stability, high data retention, and use of low programming current.

Efforts have been made to form thick free regions that have high MA strength by positioning the free region between two MA-inducing materials, which doubles the surface area of the magnetic material exposed to the MA-inducing material. However, MA-inducing material may be prone to structural defects in its microstructure when formed over conventional base materials of MRAM cell structures (e.g., base materials such as tantalum (Ta) or ruthenium (Ru)). The structural defects in the MA-inducing material may lead to the overlying magnetic material of the free region being formed with structural defects or to the structural defects propagating from the MA-inducing material to the magnetic material after the magnetic material is formed. Moreover, where the free region is thick, the structural defects may be more pronounced, having more volume in which to form and propagate. The defects in the free region may degrade the magnetic properties of the region and, also, the MRAM cell as a whole. Therefore, fabricating MRAM cells with dual surface/interface MA-inducing regions to achieve high MA strength without degrading other properties often presents challenges.

In addition, attempts to increase MA strength, decrease programming current, increase TMR, increase thermal stability, or increase the energy barrier ratio Eb/kT are also often met with the challenges of maintaining consistency from cell to cell in an array of MRAM cells and of selecting materials that are not prone to degradation during the fabrication processes. For example, some materials that may be conducive to forming magnetic regions with high MA strength may have a low thermal tolerance or may have a tendency to be formed with structural defects, leading to inconsistent characteristics or degradation of characteristics within a memory array. Variations in physical, chemical, or other characteristics of the MRAM cells, may lead to increased electrical resistance variation between cells and variations in other magnetic properties, which then lead to less reliable operation and functioning of the array, overall. Thus, fabricating arrays of MRAM cells with precision and consistency from cell to cell and without sacrificing performance has often presented challenges.

DETAILED DESCRIPTION

Figure 1A:
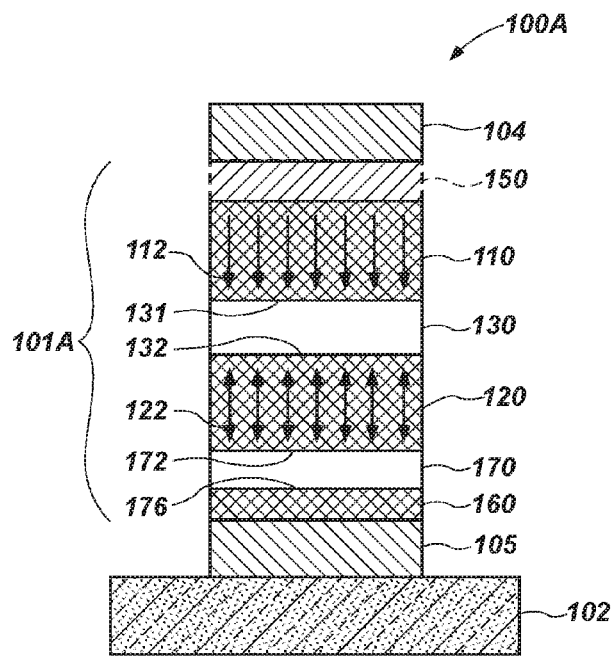
FIG. 1A is a cross-sectional, elevational, schematic illustration of a magnetic cell structure according to an embodiment of the present disclosure, wherein a seed region is directly on a lower electrode.

Memory cells, methods of forming memory cells, semiconductor devices, memory systems, and electronic systems are disclosed. The memory cells include a seed region overlying a substrate and include a plurality of magnetic and nonmagnetic regions formed over the seed region. The seed region, which may include at least one of cobalt (Co), iron (Fe), and boron (B) (e.g., a CoFeB material), provides a foundation that enables forming an overlying, magnetic anisotropy ("MA")-inducing, nonmagnetic region with a desired crystalline microstructure (e.g., a bcc (001) crystalline structure). The microstructure of the nonmagnetic region enables formation of an overlying magnetic region (e.g., the free region of the memory cell) with a desired microstructure (e.g., the bcc (001) crystalline structure). The crystalline structure of either or both of the nonmagnetic region and the overlying magnetic region may be effected either at initial formation or during a subsequent anneal. At least in part because of the desired crystalline structure of the free region, the free region may be formed to be thick without being prone to structural defects that degrade the characteristics of the region. Accordingly, a magnetic memory cell may have a magnetic region (e.g., the free region) between two MA-inducing nonmagnetic regions, which enables a high MA strength, while also being formed to a thickness that enables a high data retention ratio (i.e., high Eb/kT), use of a low programming current, and a high tunnel magnetoresistance ("TMR"). Further, the crystalline structure of the free region may also enable formation of memory cells with precision and consistency such that the cells exhibit low cell-to-cell electrical resistance variation (R_sigma) and low variation of other magnetic properties from cell-to-cell in a memory array.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The nonmagnetic region may be an electrically insulative (e.g., dielectric) region, in a magnetic tunnel junction ("MTJ") configuration. Alternatively, the non-magnetic region may be an electrically conductive region, in a spin-valve configuration.

As used herein, the terms "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region, e.g., the free region, of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region" means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "base," when referring to a region or material, means and includes the lowest-most region or material of a plurality of such regions or materials. For example, the "base magnetic region" refers to the lowest magnetic region compared to other magnetic regions.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD"), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes a seed region. The seed region provides a structural foundation for forming a lower nonmagnetic region (e.g., an MA-inducing region) thereover. The seed region may be configured to enable formation of the lower nonmagnetic region at a desired crystal structure (e.g., a bcc (001) structure). The crystal structure of the lower nonmagnetic region enables formation of a free region thereover at a desired crystal structure, either at initial formation of the magnetic material of the free region or during an anneal thereof.

An intermediate nonmagnetic region (e.g., a tunnel region) and a fixed region are formed, from bottom to top, over the free region. In some embodiments, the lower materials (i.e., the materials of the seed region, the lower nonmagnetic region, the free region, and the intermediate nonmagnetic region) may be annealed to crystallize some or all of the materials. The resulting cell core, with crystallized material, may enable formation of memory cells with high MA strength, high TMR, low programming current, high energy barrier ratios (i.e., high Eb/kT ratios), low cell-to-cell electrical resistance variation, and low cell-to-cell variation of magnetic properties.

Figure 6:
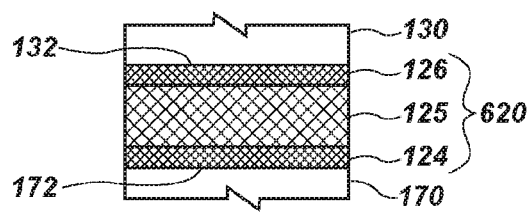
FIG. 6 is a partial, cross-sectional, elevational, schematic illustration of a magnetic cell structure according to an embodiment of the present disclosure, wherein a free region comprises multiple sub-regions.

FIG. 1A illustrates an embodiment of a magnetic cell structure 100A according to the present disclosure. The magnetic cell structure 100A includes a magnetic cell core 101A over a substrate 102. The magnetic cell core 101A may be disposed between an upper electrode 104 above and a lower electrode 105 below. The magnetic cell core 101A includes at least two magnetic regions, for example, a "fixed region" 110 and a "free region" 120 with an intermediate nonmagnetic region 130 between. Either or both of the fixed region 110 and the free region 120 may be formed homogeneously or, optionally, may be formed to include more than one sub-region (see. FIGS. 2C and 6, discussed further below). The intermediate nonmagnetic region 130 may be configured as a tunnel region and may contact the free region 120 along an interface 132 and may contact the fixed region 110 along an interface 131.

One or more upper intermediary regions 150 may, optionally, be disposed over the magnetic regions (e.g., the fixed region 110 and the free region 120) of the magnetic cell 100A structure.

The magnetic cell core 101A includes a seed region 160 over the substrate 102. The seed region 160 may provide a smooth template upon which overlying materials are formed, as discussed in more detail below. In some embodiments, such as that illustrated in FIG. 1A, the seed region 160 may be formed directly on the bottom electrode 105. In other embodiments, such as that illustrated in FIG. 1B, the seed region 160 may be formed on one or more lower intermediary regions 140. Such lower intermediary regions 140 may be configured to inhibit diffusion between the lower electrode 105 and the seed region 160 during operation of the memory cell.

A lower nonmagnetic region 170 is formed over (e.g., directly on) the seed region 160, such that an upper surface of the seed region 160 and a lower surface of the lower nonmagnetic region 170 may contact one another at an interface 176. The seed region 160 thus provides the foundation for formation of the lower nonmagnetic region 170. The seed region 160 is formulated and configured to enable formation of the lower nonmagnetic region 170 to have a crystal structure that enables formation of the free region 120, over the lower nonmagnetic region 170, with a desired crystal structure (e.g., a bcc (001) crystalline structure).

The free region 120 may be formed over (e.g., directly on) the lower nonmagnetic region 170. Thus, an upper surface of the lower nonmagnetic region 170 and a lower surface of the free region 120 may contact one another at an interface 172.

Figure 1B:
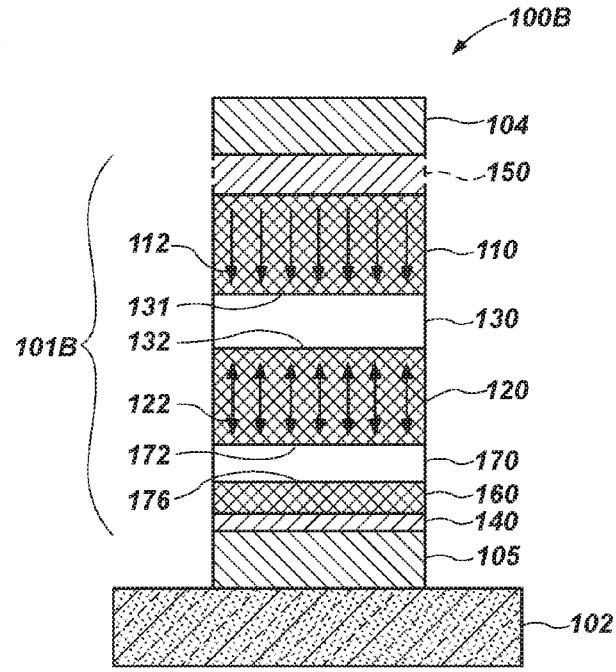
FIG. 1B is a cross-sectional, elevational, schematic illustration of a magnetic cell structure according to an embodiment of the present disclosure, wherein a lower intermediary region is disposed between a seed region and a lower electrode.

In some embodiments, the memory cells of embodiments of the present disclosure may be configured as either in-plane STT-MRAM cells or out-of-plane STT-MRAM cells. "In-plane" STT-MRAM cells include magnetic regions exhibiting a magnetic origination that is predominantly oriented in a horizontal direction, while "out-of-plane" STT-MRAM cells include magnetic regions exhibiting a magnetic orientation that is predominantly oriented in a vertical direction. For example, as illustrated in FIGS. 1A and 1B, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As illustrated in FIGS. 1A and 1B by arrows 112 and double-pointed arrows 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIGS. 1A and 1B. The magnetic orientation of the free region 120, on the other hand, may be switched, during operation of the cell, between a parallel configuration and an anti-parallel configuration, as indicated by double-pointed arrows 122 of FIGS. 1A and 1B.

Figure 2A:
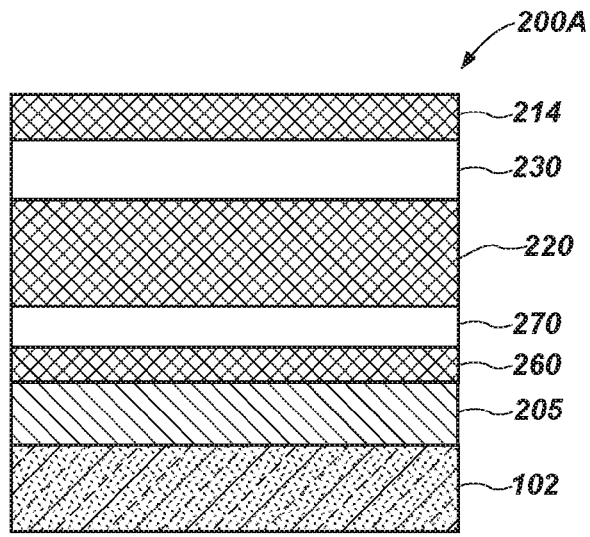
FIGS. 2A through 2C are cross-sectional, elevational, schematic illustrations of a magnetic cell structure during various stages of processing, according to an embodiment of the present disclosure, wherein a portion of material to be included in a fixed region of a magnetic cell is formed over underlying materials and then exposed to an annealing process before the remainder of the materials of the magnetic cell are formed and patterned.
Figure 2B:
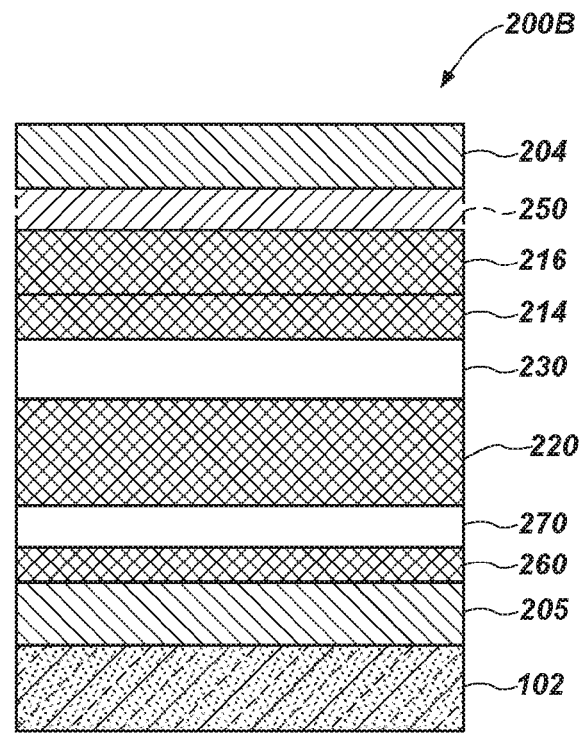
Figure 2C:
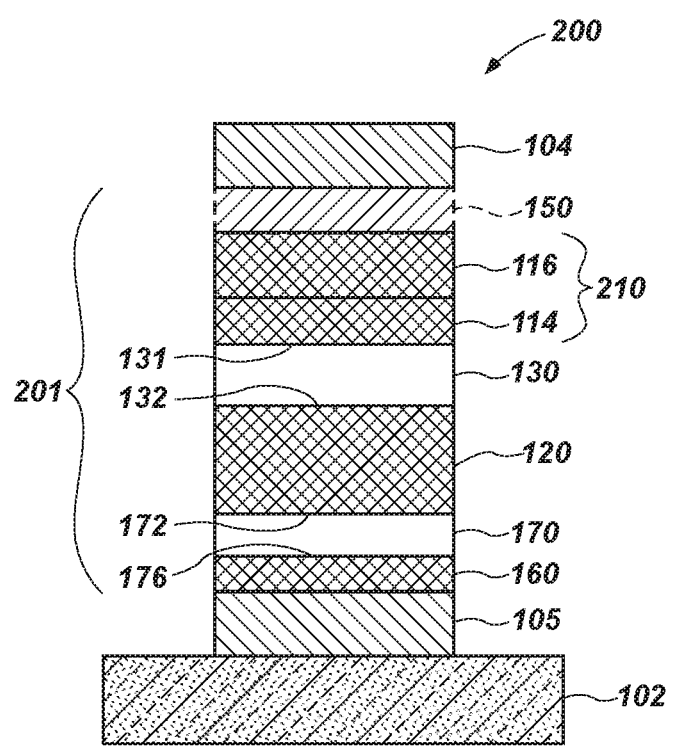

With reference to FIGS. 2A through 2C, illustrated are stages in a method of fabricating magnetic cell structures, such as the magnetic cell structure 100A of FIG. 1A (in which the seed region 160 is directly on the lower electrode 105) and a magnetic cell structure 100B of FIG. 1B (in which the seed region 160 is indirectly on the lower electrode 105, a lower intermediary region 140 being disposed between). As illustrated in FIG. 2A, a structure 200A may be formed, from bottom to top, with a conductive material 205 formed over the substrate 102, a seed material 260 over the conductive material 205, a nonmagnetic material 270 over the seed material 260, a magnetic material 220 over the nonmagnetic material 270, another nonmagnetic material 230 over the magnetic material 220, and another magnetic material 214 over the another nonmagnetic material 230.

The conductive material 205, from which the lower electrode 105 (FIGS. 1A and 1B) is formed, may comprise, consist essentially of, or consist of, for example and without limitation, a metal (e.g., copper, tungsten, titanium, tantalum), a metal alloy, or a combination thereof.

The seed material 260 may comprise, consist essentially of, or consist of magnetic material (e.g., CoFeB material or a magnetic material other than a CoFeB material).

In some embodiments, the seed material 260, from which the seed region 160 (FIGS. 1A and 1B) is formed, may be formulated and configured to exhibit magnetism. For example, the seed material 260 may be a magnetic material formed to a thickness at which magnetism is exhibited. Such magnetic material may comprise, consist essentially of, or consist of at least one of cobalt (Co), iron (Fe), and boron (B) (e.g., CoFeB, wherein x=10 to 80, y=10 to 80, and z=0 to 50 (referred to herein as a "CoFeB material")).

In other embodiments, the seed material 260 may comprise a magnetic material, but may be configured to not exhibit magnetism. For example, and without limitation, the seed material 260 may comprise, consist essentially of, or consist of at least one of Co, Fe, and B (e.g., a CoFeB material), but may be thin (e.g., about 6 Å (about 0.6 nm)) and so not exhibit magnetism impacting other regions of the cell structure, as discussed further below.

In some embodiments, the seed material 260 may comprise, consist essentially of, or consist of material comprising the same elements as the material of one or more of the overlying magnetic regions (e.g., the fixed region 110 and the free region 120 (FIGS. 1A and 1B)). For example, and without limitation, each of the seed material 260, the fixed region 110, and the free region 120 may be formed from materials comprising Co, Fe, and B. In some such embodiments, the atomic ratios of Co:Fe:B in each of the seed material 260, the fixed region 110, and the free region 120 may differ. In other embodiments, the seed material 260 may comprise, consist essentially of, or consist of another magnetic material (regardless of whether or not the seed material 260 is configured to exhibit magnetism), a nonmagnetic material (e.g., a nonmagnetic conductive material (e.g., a nickel-based material)), or a combination thereof.

The seed region 160 may be formed by, for example and without limitation, growing the seed material 260 directly on the conductive material 205, or, in embodiments in which a lower intermediary region 140 (FIG. 1B) is to be disposed between the seed region 160 (FIG. 1B) and the lower electrode 105 (FIG. 1B), directly on the material of the lower intermediary region 140. In some embodiments, the seed material 260 may be amorphous upon formation over the conductive material 205.

In embodiments in which the seed material 260 is formed over material of the lower intermediary region 140 (FIG. 1B), the lower intermediary region 140 may be formed from, for example and without limitation, tantalum (Ta), titanium (Ti), tantalum nitride (TaN), titanium nitride (TiN), ruthenium (Ru), tungsten (W), or a combination thereof.

In some embodiments, the lower intermediary region 140 (FIG. 1B), if included, may be incorporated with the conductive material 205 from which the lower electrode 105 (FIGS. 1A and 1B) is to be formed. For example, the material of the lower intermediary region 140 may be an upper-most material of the conductive material 205.

The nonmagnetic material 270, from which the lower nonmagnetic region 170 (FIGS. 1A and 1B) is formed, may comprise, consist essentially of, or consist of, for example and without limitation, a nonmagnetic oxide material (e.g., magnesium oxide (MgO), aluminum oxide ($Al_2O_3$), titanium dioxide ($TiO_2$), or other oxide materials of conventional MTJ regions). The nonmagnetic material 270 may be formed (e.g., grown, deposited) directly on the seed material 260.

In embodiments in which the seed material 260 is amorphous when initially formed, the nonmagnetic material 270 may have a crystal structure when initially formed. For example, and without limitation, the seed material 260 may comprise a CoFeB material initially formed to be amorphous, and the nonmagnetic material 270 may comprise MgO initially formed to have a bcc (001) crystalline structure. The crystal structure of the nonmagnetic material 270 may be enabled by the amorphous structure of the seed material 260.

The magnetic material 220, from which the free region 120 (FIGS. 1A and 1B) is formed, may comprise, consist essentially of, or consist of, for example and without limitation, ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the magnetic material 220 may comprise at least one of Co, Fe, and B (e.g., a CoFeB material). In some embodiments, the magnetic material 220 may be formed of the same material as the seed material 260 or from a material comprising the same elements as the seed material 260, though the relative atomic ratios of the elements within the materials may differ. The magnetic material 220 may be formed as a homogeneous region. In other embodiments, such as that illustrated in FIG. 6, discussed further below, the magnetic material 220 may be formed of one or more sub-regions of CoFeB material, with the sub-regions having different relative ratios of Co, Fe, and B.

The another nonmagnetic material 230, from which the intermediate nonmagnetic region 130 (FIGS. 1A and 1B) is formed, may comprise, consist essentially of, or consist of, for example and without limitation, a nonmagnetic oxide material (e.g., magnesium oxide (MgO), aluminum oxide ($Al_2O_3$), titanium dioxide ($TiO_2$), or other oxide materials of conventional MTJ regions). The another nonmagnetic material 230 may be formed of the same material as nonmagnetic material 270 or from a material having the same elements as the nonmagnetic material 270, though ratios of elements within the materials may differ. For example, and without limitation, both of the another nonmagnetic material 230 and the nonmagnetic material 270 may be formed from material including magnesium (Mg) and oxygen (O), e.g., MgO. The another nonmagnetic material 230 may be formed (e.g., grown, deposited) directly on the magnetic material 220. The another nonmagnetic material 230 may be amorphous when initially formed.

In some embodiments, such as that illustrated in FIG. 2A, the another magnetic material 214, from which a lower portion of the fixed region 110 (FIGS. 1A and 1B) (i.e., a lower fixed region 114 (see FIG. 2C)) is formed, may be formed (e.g., grown, deposited) directly on the another nonmagnetic material 230. The another magnetic material 214 may comprise, consist essentially of, or consist of, for example and without limitation, ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the another magnetic material 214 may comprise a CoFeB material. In some embodiments, the another magnetic material 214 may be the same material as either or both of magnetic material 220 and seed material 260.

The structure 200A of FIG. 2A may then be annealed to crystallize at least the magnetic material 220 of the free region 120 (FIG. 2C) into a desired crystal structure. For example, during annealing, the crystal structure of the nonmagnetic material 270 may propagate to the magnetic material 220 of the free region 120 (FIG. 2C) to alter the microstructure of the magnetic material 220 from its original structure, which may have been amorphous, to a desired crystalline structure (e.g., a bcc (001) crystalline structure).

In some embodiments, each of the materials of the structure 200A over the conductive material 205 (i.e., the seed material 260, the nonmagnetic material 270, the magnetic material 220, the another nonmagnetic material 230, and the another magnetic material 214) may have a crystalline structure following the anneal, which crystalline structure may be the same structure in each of the materials. For example, each of the seed material 260, the magnetic material 220, and the another magnetic material 214 may be converted from an initial, amorphous structure into a crystalline structure due to propagation of the structure from the nearby, initially-crystalline nonmagnetic material 270 and another nonmagnetic material 230.

In other embodiments, the nonmagnetic material 270 may, upon formation, have a structure other than a desired crystal structure, but annealing the structure 200A may alter the microstructure of the nonmagnetic material 270 into the desired crystal structure. In such embodiments, the nonmagnetic material 270 may be annealed before the magnetic material 220 is formed thereover and before another anneal to propagate the desired crystal structure from the nonmagnetic material 270 to the magnetic material 220.

Accordingly, the structure 200A may be formed to include a crystallized magnetic material 220 from which the free region 120 (FIG. 2C) is to be formed and wherein the crystalline structure of the magnetic material 220 is enabled by influence of the nonmagnetic material 270 on the overlying magnetic material 220.

In embodiments in which annealing is utilized to enable the magnetic material 220 to have the desired crystalline structure, the annealing process may be carried out in situ, in some embodiments, or ex situ, in other embodiments. The annealing process may use an annealing temperature of from about 300° C. to about 600° C. (e.g., about 400° C.) and may be held at the annealing temperature for from about one minute to about one hour. The annealing temperature and time may be tailored based on the materials of the structure 200A and the desired crystal structure.

After formation of the structure 200A and, if utilized, the annealing process, the remaining materials of the magnetic cell structure may be fabricated, as illustrated in FIG. 2B. These upper-most materials may not be subjected to an annealing process. However, in some embodiments, the upper-most materials may be subjected to an anneal, but this subsequent anneal may not be at a temperature as high as that used in the initial anneal. Therefore, the upper-most materials (e.g., materials of the fixed region 110, upper intermediary region 150, and upper electrode 104) may be selected from a variety of materials that include those that would have been degraded by the high temperature of the initial anneal. Accordingly, magnetic materials that yield high MA strengths may be utilized even though those materials may have lower thermal budgets than the another magnetic material 214 (or the magnetic material 220 or the seed material 260) that was subjected to the anneal. For example, the magnetic material 216 may include cobalt/palladium (Co/Pd) multi-sub-regions; cobalt/platinum (Co/Pt) multi-sub-regions; cobalt iron terbium (Co/Fe/Tb) based materials, LiO materials, or other magnetic materials of conventional fixed regions.

The magnetic material 216 may be formed over the another magnetic material 214. The another magnetic material 214 and the magnetic material 216 may, together, form the fixed region 110 (FIGS. 1A and 1B). Therefore, a portion of the fixed region 110 may be crystallized, e.g., in the bcc (001) structure, due to the annealing process, while an upper portion of the fixed region 110 may have a different crystal structure (e.g., an amorphous structure or a crystalline structure other than the bcc (001) structure). In some embodiments, during subsequent processing, the crystal structure of the upper portion of the fixed region 110 may convert to the same crystal structure as the lower portion of the fixed region 110.

In some embodiments, optionally, one or more intermediary materials 250 may be formed over the magnetic material 216. The intermediary materials 250, which, if included, form the optional upper intermediary regions 150 (FIGS. 1A and 1B), may comprise, consist essentially of, or consist of materials configured to ensure a desired crystal structure in neighboring materials. The intermediary materials 250 may alternatively or additionally include metal materials configured to aid in patterning processes during fabrication of the magnetic cell, barrier materials, or other materials of conventional STT-MRAM cell core structures. In some embodiments, the intermediary materials 250 may include a conductive material (e.g., one or more materials such as copper, tantalum, titanium, tungsten, ruthenium, tantalum nitride, or titanium nitride) to be formed into a conductive capping region.

A conductive material 204, from which the upper electrode 104 (FIGS. 1A and 1B) may be formed, may be formed over the magnetic material 216. For example, in some embodiments, the conductive material 204 may be formed directly on the magnetic material 216. In other embodiments in which the intermediary materials 250 are present, the conductive material 204 may be formed directly on the intermediary materials 250.

A resulting precursor structure 200B may then be patterned, in one or more stages, to form a magnetic cell structure 200, as illustrated in FIG. 2C. Techniques for patterning structures such as the precursor structure 200B to form structures such as the magnetic cell structure 200 are known in the art and so are not described herein in detail.

After patterning, the magnetic cell structure 200 includes a magnetic cell core 201 having a fixed region 210 comprising the lower fixed region 114, formed from the annealed another magnetic material 214, and an upper fixed region 116, formed from the magnetic material 216. The lower fixed region 114 may have a different crystal structure than the upper fixed region 116.

The free region 120 of the magnetic cell structure 200, being formed in a structure enabled by influence of the seed region 160, may therefore be formed with minimal structural defects. That is, the smoothness provided by the seed material 260 may function as a template to enable formation of overlying materials, including the magnetic material 220 of the free region 120, with minimal propagation of defects as materials are subsequently formed over one another. Likewise, the annealing of the magnetic material 220 of the free region 120 further promotes a substantially defect-free microstructure with a desired crystallinity. Such crystallinity in the free region 120 may not be feasible were the free region 120 to be formed over the fixed region 110, because the fixed region 110 would be formed of magnetic materials that may be degraded by exposure to high temperatures of an anneal, and such degradation may propagate to the free region 120, thereby degrading the free region 120. Accordingly, the magnetic cell structure 200 including the free region 120, formed proximate to the seed region 160 and with desired crystal structure, enables the magnetic cell structure 200 to have a high TMR, a high energy barrier ratio (Eb/kT), a low switching current, a low cell-to-cell electrical resistance variation (R_sigma), and low cell-to-cell variation of magnetic properties.

Furthermore, in the magnetic cell core 201, the exposure of the free region 120 to two nonmagnetic regions (i.e., the lower nonmagnetic region 170 and the intermediate nonmagnetic region 130), which may be formulated to be MA-inducing regions (e.g., oxide regions), at two interfaces (i.e., interface 132 and interface 172) may induce magnetic anisotropy ("MA") at both interfaces (the interface 132 and the interface 172) such that the free region 120 has a higher MA strength than a magnetic region exposed to a nonmagnetic region along only one side. The higher MA may be enabled even with formation of the free region 120 at a greater thickness (e.g., at about 15 Å and above, e.g., at about 50 Å and above); whereas, in conventional structures, thick magnetic regions adjacent to one MA-inducing region generally exhibited lower MA strengths. Ultimately, the thickness at which the free region 120 is formed may be tailored to achieve desired properties of the free region 120 (e.g., TMR and energy barrier (Eb)).

With continued reference to FIG. 2C, in some embodiments, the seed region 160 may be configured and formulated not to magnetically contribute to the magnetic cell structure 200. That is, the seed region 160 may not produce a magnetic field that substantially impacts operation of the magnetic cell structure 200, including the switching of the magnetic orientation of the free region 120. In such embodiments, the seed region 160 may be thin, compared to, e.g., the free region 120. For example, and without limitation, the seed region 160 may be formed to have a thickness (i.e., a height) of about 6 Å (about 0.6 nm), while the free region 120 may be formed to have a thickness of about 14 Å (1.4 nm).

Also with reference to FIG. 2C, in some embodiments, the lower nonmagnetic region 170 may be structured to be thinner than the intermediate nonmagnetic region 130 such that, of the two nonmagnetic regions (i.e., the intermediate nonmagnetic region 130 and the lower nonmagnetic region 170), only the intermediate nonmagnetic region 130 may be configured as a tunnel region (e.g., a spin filter) of the magnetic cell core 201. For example, the lower nonmagnetic region 170 may be formed to have a thickness of about 2 Å (about 0.2 nm) to about 8 Å (about 0.8 nm) while the intermediate nonmagnetic region 130 may be formed to have a thickness of about 6 Å (about 0.6 nm) to about 15 Å (about 1.5 nm). The lower nonmagnetic region 170, while not configured to function as a spin filter, may contribute to surface/interface anisotropy along interface 172.

In embodiments in which the lower nonmagnetic region 170 is thinner than the intermediate nonmagnetic region 130, the lower nonmagnetic region 170 may be configured to enable out-diffusion of boron, from neighboring magnetic material (e.g., a CoFeB material) during annealing. As discussed further below, this may enable formation of the neighboring magnetic regions to have portions proximate to an interface (e.g., the interface 172) having a greater ratio of iron to boron than more distal portions of the neighboring magnetic regions, which may promote inducement of surface/interface MA.

In one embodiment, the magnetic cell structure 200 includes the seed region 160 formed from a CoFeB material, the lower nonmagnetic region 170 formed from MgO, the free region 120 formed from a CoFeB material, the intermediate nonmagnetic region 130 formed from MgO, and at least the lower fixed region 114 formed from a CoFeB material. Upon initial formation, all of the CoFeB material regions may be amorphous and all of the MgO regions may be crystalline (e.g., with a bcc (001) crystalline structure). During annealing, the crystalline structure of the MgO regions may propagate to the CoFeB material regions, crystallizing the CoFeB material into the same crystalline structure (e.g., the bcc (001) crystalline structure) as the MgO material. The annealing may be performed at a temperature of about 300° C. to about 400° C., to crystallize the regions in the bcc (001) crystalline structure. The seed region 160 may be formed directly on the lower electrode 105, which may include at least a top portion comprising, consisting essentially of, or consisting of tantalum (Ta). The CoFeB material of each of the seed region 160, the free region 120, and the lower fixed region 114 may have the same or different elemental ratios of Co, Fe, and B. The upper fixed region 116 may be formed of the same or a different magnetic material than that of the lower fixed region 114. However, the crystal structure of the upper fixed region 116 differs from the bcc (001) crystalline structure of the lower fixed region 114.

Accordingly, disclosed is a memory cell comprising a magnetic cell core. The magnetic cell core comprises a seed region comprising at least one of cobalt, iron, and boron. A lower nonmagnetic region is disposed over the seed region. A magnetic region is disposed over the lower nonmagnetic region and exhibits a switchable magnetic orientation. An intermediate nonmagnetic region is disposed over the magnetic region. Another magnetic region is disposed over the intermediate nonmagnetic region. The another magnetic region exhibits a fixed magnetic orientation.

Because the seed material 260 (FIG. 2A) provides a smooth template on which to form the lower nonmagnetic region 170 with a crystal structure that enables crystallization of the free region 120, the resulting final magnetic cell structure 200 (FIG. 2C) may have the magnetic cell core 201 with at least its lower regions (e.g., the lower nonmagnetic region 170, the free region 120, and the intermediate nonmagnetic region 130) formed with minimal defects in the structure. In contrast, forming material (e.g., the nonmagnetic material 270 (FIG. 2A) of the lower nonmagnetic region 170) on a rough surface or a damaged surface may lead to the overlying materials having a corresponding rough or damaged structure. The resulting crystalline structure of the free region 120 and the minimized defects therein may enable formation of the free region 120 at a thickness that provides a high TMR, high energy barrier ratio (i.e., Eb/kT), use of low programming current. The double-exposure of the free region 120 to MA-inducing nonmagnetic material (in the lower nonmagnetic region 170 and the intermediate nonmagnetic region 130) enables formation of the free region 120 at a high MA strength. Moreover, the crystalline structure and minimized structural defects also enable formation of a number of magnetic cell structures 200 with precision and low cell-to-cell variation and, thus, low cell-to-cell electrical resistance variation (R_sigma) and low cell-to-cell variation of other magnetic properties of the magnetic cell structures 200. The enhanced magnetic, electrical, and physical properties of the resulting structures may also enable scaling of the cell structures.

Figure 3A:
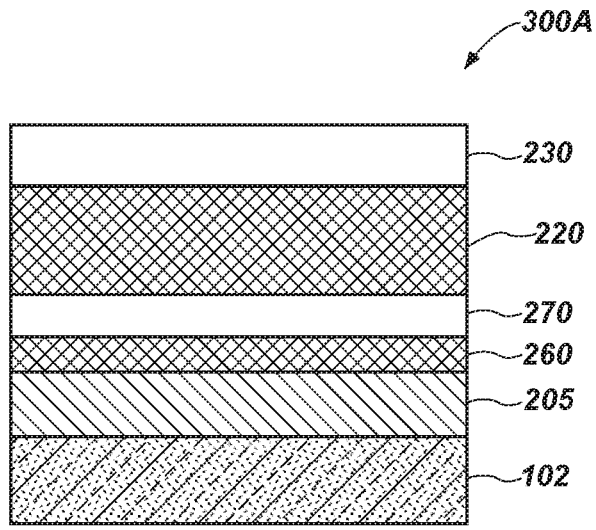
FIGS. 3A and 3B are cross-sectional, elevational, schematic illustrations of a magnetic cell structure during various stages of processing, according to an embodiment of the present disclosure, wherein material to be included in a fixed region of the magnetic cell is formed after underlying materials are annealed.
Figure 3B:
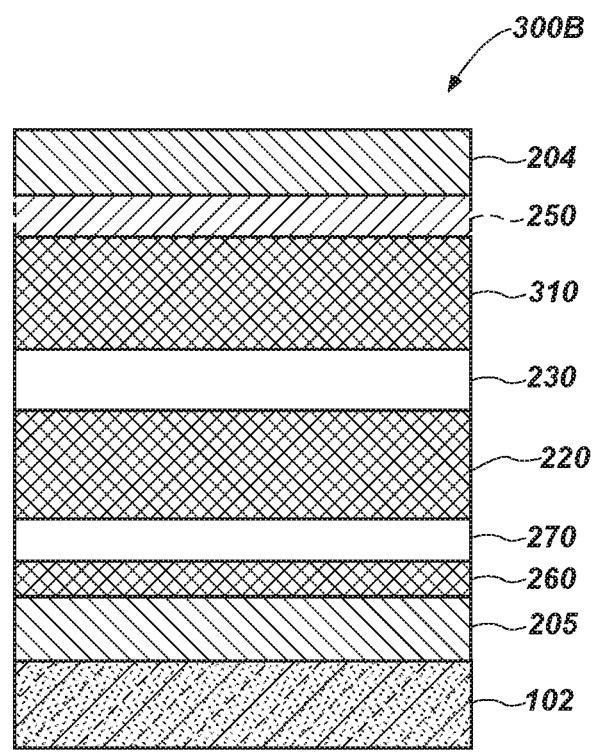

With reference to FIGS. 3A and 3B, illustrated are stages in an alternate method of forming a magnetic memory cell according to an embodiment of the present disclosure. As illustrated in FIG. 3A, a structure 300A may be formed to include, over the substrate 102 and from base to top, the conductive material 205, the seed material 260, the nonmagnetic material 270, the magnetic material 220, and the another nonmagnetic material 230. The structure 300A may be annealed, as discussed above. Thus, the structure 300A may be annealed, e.g., to propagate a crystalline structure from the nonmagnetic material 270 to the magnetic material 220, before material of the fixed region 110 (FIGS. 1A and 1B) is formed. Each of the materials in the structure 300A may be crystallized, or at least the magnetic material 220 may be crystallized in a desired crystal structure (e.g., in the bcc (001) structure), by the anneal process. The crystal structure of the magnetic material 220 may be enabled by the neighboring nonmagnetic material 270.

As illustrated in FIG. 3B, the remaining materials of a precursor structure 300B may be formed over the annealed materials. For example, a magnetic material 310, from which the fixed region 110 (FIGS. 1A and 1B) is to be formed, may be formed (e.g., grown, deposited) on the another nonmagnetic material 230. The magnetic material 310 may have a different crystal structure than the annealed material on which it is formed. For example, the magnetic material 310 may be amorphous or may have a crystal structure other than the bcc (001) structure if the underlying materials have the bcc (001) structure following the anneal. The magnetic material 310 may be formed of ferromagnetic material including cobalt (Co) and iron (Fe) (e.g., $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). In some embodiments, the magnetic material 310 may be the same as the magnetic material 220 and, optionally, also the same as the seed material 260.

Optionally, one or more of the intermediary materials 250 may be formed over the magnetic material 310. The conductive material 204 is formed over the magnetic material 310, which may complete formation of the precursor structure 300B. The precursor structure 300B may then be patterned to form the magnetic cell structure 100A of FIG. 1A.

Figure 4:
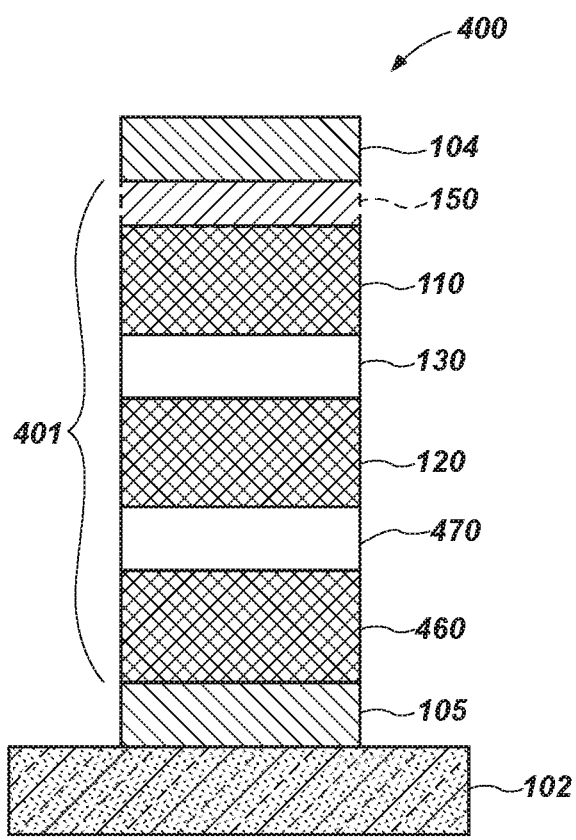
FIG. 4 is a cross-sectional, elevational, schematic illustration of a magnetic cell structure according to an embodiment of the present disclosure, wherein a seed region may be configured to exhibit magnetism.

With reference to FIG. 4, the seed region 460 may be configured to exhibit a magnetism that affects operation of the magnetic cell core 401. In some such embodiments, the seed region 460 may be configured to exhibit a fixed magnetic orientation. The magnetic orientation of the seed region 460 may be oppositely directed to the magnetic orientation of the fixed region 110, and magnetic dipole fields emitted by the seed region 460 and the fixed region 110 may be substantially symmetrically disposed around the free region 120. Accordingly, a magnetic dipole field emitted by one of the seed region 460 and the fixed region 110 may be substantially cancelled by a magnetic dipole field emitted by the other of the seed region 460 and the fixed region 110. With such cancellation, the magnetic dipole fields emitted by the seed region 460 and the fixed region 110 may not substantially interfere with switching of the magnetic orientation of the free region 120, which may promote symmetrical switching of the free region 120. Symmetrical switching may enhance the reliability of the magnetic cell core 401 during operation.

Also as illustrated in FIG. 4, in some embodiments, the lower nonmagnetic region 470 may be formed from the nonmagnetic material 270 (FIG. 2A), as described above, and both the intermediate nonmagnetic region 130 and the lower nonmagnetic region 470 may be formulated, located, and otherwise configured to function as tunnel regions (e.g., spin filters) during operation of the magnetic cell core 401.

Figure 5A:
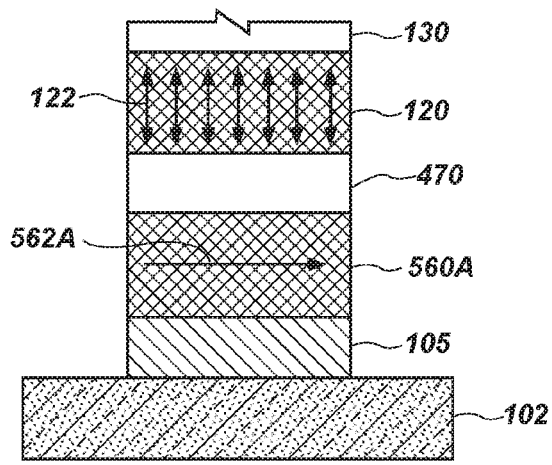
FIG. 5A is a partial, cross-sectional, elevational, schematic illustration of a magnetic cell structure according to an embodiment of the present disclosure, wherein a seed region is formed of a magnetic material exhibiting an in-plane magnetic orientation.

In some embodiments, a base magnetic region (e.g., the seed region 160 of FIGS. 1A, 1B, and 2C; the seed region 460 of FIG. 4) may be configured to exhibit a magnetic orientation that is substantially perpendicular to the magnetic orientation of an overlying magnetic region (e.g., the free region 120). For example, the seed region 460 may be formulated, formed, and otherwise configured as a seed region 560A, illustrated in FIG. 5A, exhibiting an in-plane (e.g., horizontal) magnetic orientation, as indicated by arrow 562A. In such embodiments the seed region 560A may be configured to not magnetically affect operation of the cell core. Thus, the seed region 560A may be formed to be substantially thinner than the magnetic regions of the cell core (e.g., the free region 120 and the fixed region 110 (FIGS. 1A and 1B)). However, in other embodiments, the seed region 560A may be formed to have substantially the same thickness as other magnetic regions, as illustrated in FIG. 5A. Those of ordinary skill in the art are familiar with materials and methods of formation to fabricate a magnetic region exhibiting an in-plane magnetic orientation; thus, these materials and methods are not described in detail herein.

Figure 5B:
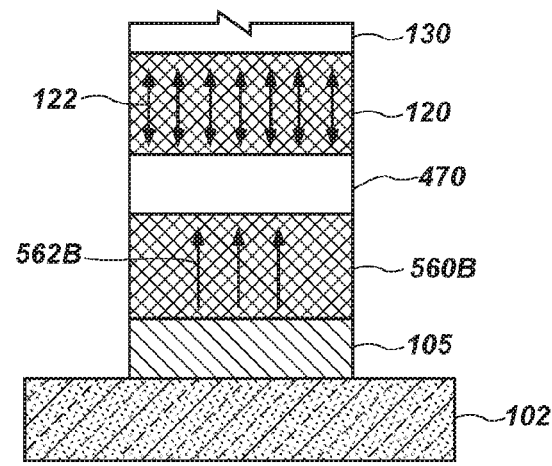
FIG. 5B is a partial, cross-sectional, elevational, schematic illustration of a magnetic cell structure according to an embodiment of the present disclosure, wherein a seed region is formed of a magnetic material exhibiting an out-of-plane magnetic orientation.

With reference to FIG. 5B, the base magnetic region (e.g., the seed region 160 of FIGS. 1A, 1B, and 2C; the seed region 460 of FIG. 4) may, alternatively, be configured to exhibit a magnetic orientation that is substantially aligned (e.g., parallel or anti-parallel) to the magnetic orientation of an overlying magnetic region (e.g., the free region 120). For example, the seed region (e.g., the seed region 160 of FIGS. 1A, 1B, and 2C; the seed region 460 of FIG. 4) may be formulated, formed, and otherwise configured as a seed region 560B, as illustrated in FIG. 5B, exhibiting an out-of-plane (e.g., vertical, perpendicular) magnetic orientation, as indicated by arrows 562B. In such embodiments, the seed region 560B may or may not be configured to magnetically affect operation of the cell core. As discussed above, in some such embodiments, the magnetic orientation of the seed region 560B (as indicated by arrow 562B may be oppositely directed (i.e., antiparallel) to the magnetic orientation of the fixed region 110 (as indicated by arrow 112 in FIG. 1A), and the seed region 560B and the fixed region 110 may be symmetrically disposed about the free region 120 to enable substantial cancellation of magnetic dipole fields emitted by the seed region 560B and the fixed region 110 (FIG. 1A).

While, in some embodiments, the material of, e.g., the seed material 260, the magnetic material 220, and the magnetic material 310 (FIG. 3B), may be each formed as single, homogeneous regions of the material, in other embodiments, e.g., one or more of the seed material 260, the magnetic material 220, and the magnetic material 310 (FIG. 3B) may be formed from multiple sub-regions of material. In some embodiments, each of the sub-regions of material may be formed of the same composition of magnetic material, while, in other embodiments, at least one of such sub-regions comprises a different composition (e.g., elemental ratio) of material than another sub-region. Each sub-region may be sequentially formed, one on another, to form the structure of the region.

For example, as discussed above with respect to FIGS. 2B and 2C, the fixed region 210 (FIG. 2C) may be formed from the another magnetic material 214 (FIG. 2B) and the magnetic material 216 (FIG. 2B). The magnetic material 216 may comprise a different magnetic material than the another magnetic material 214. For example, the another magnetic material 214 may be formed of magnetic material formulated to crystallize and withstand the conditions of the annealing process. The magnetic material 216, on the other hand, which is not subjected to annealing, may comprise magnetic material that would otherwise be damaged by exposure to the conditions of the annealing process. In other embodiments, the another magnetic material 214 and the magnetic material 216 may be formed of the same material (e.g., a CoFeB material with the same ratio of Co:Fe:B in each of the another magnetic material 214 and the magnetic material 216), though the another magnetic material 214 may be crystallized by the anneal while the magnetic material 216, not subjected to a crystallizing anneal, may be amorphous or have a crystal structure differing from that of the annealed another magnetic material 214.

As another example, as illustrated in FIG. 6, a free region 620 may be formed of multiple magnetic sub-regions, e.g., a lower free region 124, an intermediate free region 125, and an upper free region 126. In other embodiments, fewer than three or more than three sub-regions may be utilized. In some embodiments, all of the sub-regions may be formed of the same magnetic material composition, e.g., a CoFeB material with the same ratio of Co:Fe:B in each of the sub-regions. Nonetheless, the sub-regions may be independently formed, one over the other, rather than formed in one large region (e.g., as with the magnetic material 310 of FIG. 3B).

In other embodiments, however, at least one of the plurality of the lower free region 124, the intermediate free region 125, and the upper free region 126 comprises a magnetic material composition that differs from the magnetic material composition of another of the lower free region 124, the intermediate free region 125, and the upper free region 126. For example, in some embodiments, all of the lower free region 124, the intermediate free region 125, and the upper free region 126 may be formed of CoFeB materials, but the CoFeB material of the lower free region 124 and the upper free region 126 may have a higher ratio of Fe to B compared to the CoFeB material of the intermediate free region 125. Therefore, the free region 620 may be "iron rich" and "boron poor" along the interface 132 with the intermediate nonmagnetic region 130 and the interface 172 with the lower nonmagnetic region 170. The iron rich upper free region 126 and lower free region 124 may enable inducement of strong surface/interfacial MA along the interfaces 132, 172. In other embodiments (not shown), only the portion of the free region 620 that is proximate to the interface 132 may be formulated to be "iron rich." Accordingly, the free region 620, or other magnetic or nonmagnetic regions of the magnetic cell structure, may be engineered to include spatially distributed elements (i.e., sub-regions with different elemental ratios).

Figure 7A:
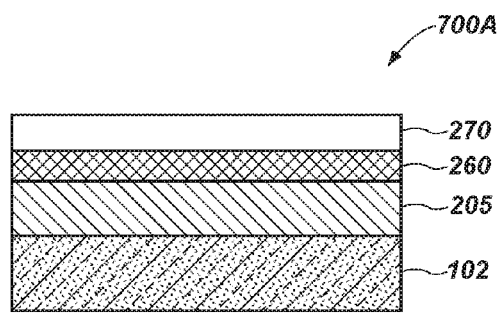
FIGS. 7A through 7C are cross-sectional, elevational, schematic illustrations of a magnetic cell structure during various stages of processing, according to an embodiment of the present disclosure, wherein a conductive material is formed on or in a nonmagnetic material, to be included in a lower nonmagnetic region, prior to formation of overlying materials.
Figure 7B:
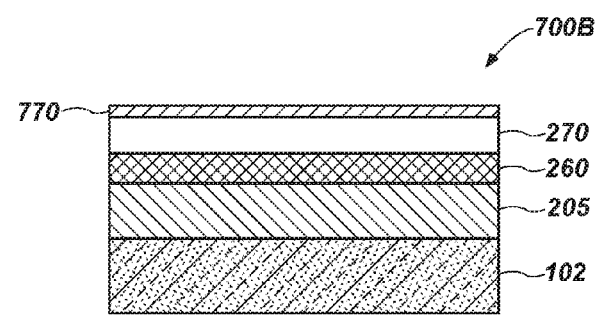
Figure 7C:
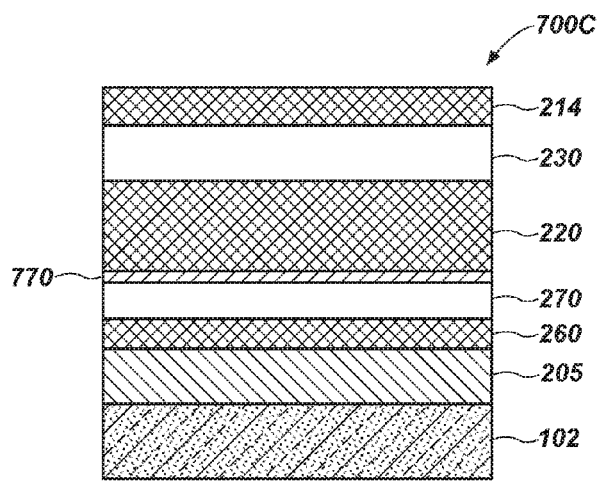

With reference to FIGS. 7A through 7C, in some embodiments, a material 770 (FIG. 7B) may be formed over the nonmagnetic material 270, with such material 770 configured to reduce the electrical resistance of the nonmagnetic material 270 and, therefore, of the lower nonmagnetic region 170 (FIG. 1A) formed therefrom. For example, a structure 700A may be formed over the substrate 102 with just the conductive material 205, the seed material 260, and the nonmagnetic material 270. As illustrated in FIG. 7B, the material 770 may be formed (e.g., deposited) over the nonmagnetic material 270, forming structure 700B. For example, the material 770 may comprise, consist essentially of, or consist of ruthenium (Ru) or an alloy thereof. The material 770 may be formed in an atomic monolayer or other thin region over the nonmagnetic material 270. In other embodiments, the material 770 may be embedded into the nonmagnetic material 270. Without being limited to any one theory, the presence of the material 770 proximate to or in the nonmagnetic material 270 may increase the electrical conductivity (and decrease the electrical resistance) of the nonmagnetic material 270 without substantially degrading the magnetic-related properties (e.g., the spin filtering function, the surface/interfacial MA-inducing properties) of the nonmagnetic material 270. In such embodiments, the nonmagnetic material 270 may, therefore, not exhibit a substantial resistance during switching of the magnetic orientation of the free region 120.

As illustrated in FIG. 7C, after forming the material 770 on or in the nonmagnetic material 270, additional materials may be formed over structure 700B (FIG. 7B), and, thus, over the nonmagnetic material 270. The additional materials may include the magnetic material 220, the another nonmagnetic material 230, and, optionally, the another magnetic material 214. A structure 700C, resulting from formation of the additional materials, may be annealed, as discussed above, to crystallize, e.g., the magnetic material 220 into the desired crystal structure, which may be enabled by the proximity of the magnetic material 220 to the nonmagnetic material 270. In some embodiments, annealing may also promote diffusion of the material 770 into the nonmagnetic material 270. After anneal, the remaining materials may be formed over the uppermost material of the structure 700C to form, e.g., the precursor structure 200B of FIG. 2B, except having a less electrically resistant nonmagnetic material 270.

Though certain annealing processes are discussed above, in other embodiments, additional anneals may be conducted before the anneal to crystallize the materials (e.g., the magnetic material 220) or after the crystallizing anneal. In some such embodiments, it is contemplated that the anneal described above as effecting the crystallization of material may be the highest temperature anneal carried out before patterning. It is also contemplated that anneals carried out after formation of materials above the crystallized structure may not be conducted at temperatures high enough to crystallize the latter-formed materials. Therefore, again, in some embodiments, the lower-most materials of the structure may be crystallized, while the upper-most materials may be amorphous or of a different crystal structure.

Accordingly, disclosed is a method of forming a magnetic memory cell. The method comprises forming a structure. Forming a structure comprises forming a seed material over a substrate and forming a nonmagnetic material over the seed material. A magnetic material is formed over the nonmagnetic material. Another nonmagnetic material is formed over the magnetic material. The structure is annealed and another magnetic material is formed over the another nonmagnetic material.

Figure 8:
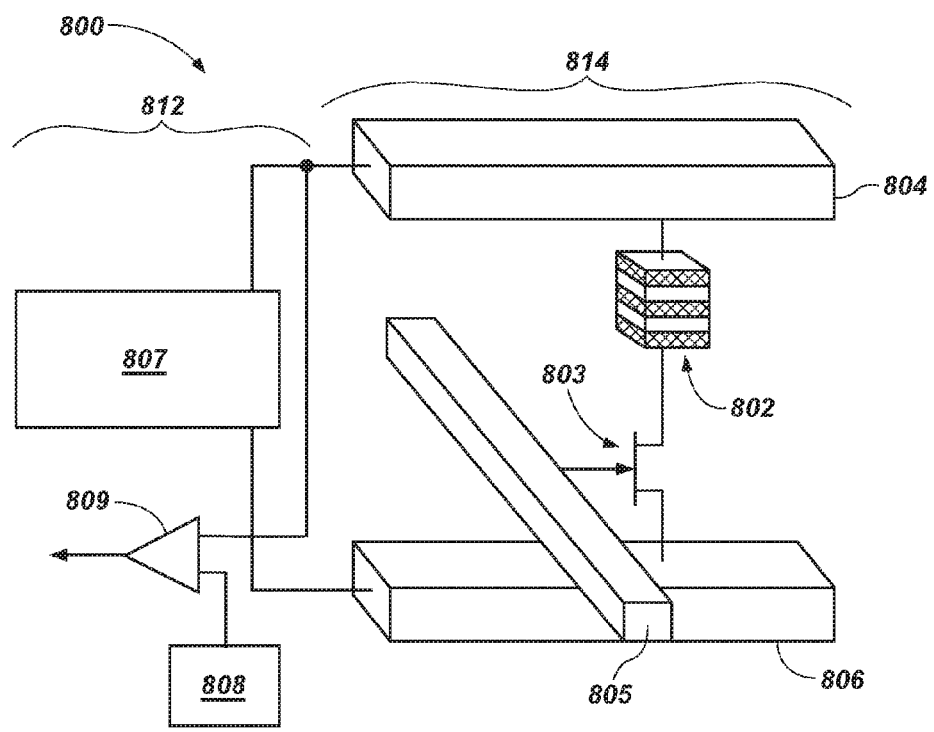
FIG. 8 is a schematic diagram of an STT-MRAM system including a memory cell having a magnetic cell structure according to an embodiment of the present disclosure.

With reference to FIG. 8, illustrated is an STT-MRAM system 800 that includes peripheral devices 812 in operable communication with an STT-MRAM cell 814, a grouping of which may be fabricated to form an array of memory cells in a grid pattern including a number of rows and columns, or in various other arrangements, depending on the system requirements and fabrication technology. The STT-MRAM cell 814 includes a magnetic cell core 802, an access transistor 803, a conductive material that may function as a data/sense line 804 (e.g., a bit line), a conductive material that may function as an access line 805 (e.g., a word line), and a conductive material that may function as a source line 806. The peripheral devices 812 of the STT-MRAM system 800 may include read/write circuitry 807, a bit line reference 808, and a sense amplifier 809. The cell core 802 may be any one of the magnetic cell cores (e.g., the magnetic cell core 101A (FIG. 1A), the magnetic cell core 101B (FIG. 1B), the magnetic cell core 201 (FIG. 2C), the magnetic cell core 401 (FIG. 4)) described above. Due to the structure of the cell core 802, the method of fabrication, or both, the STT-MRAM cell 814 may have a high TMR, a high energy barrier ratio (Eb/kT), a low programming current, a high MA strength, low cell-to-cell electrical resistance variation, and low cell-to-cell variation of magnetic properties.

In use and operation, when an STT-MRAM cell 814 is selected to be programmed, a programming current is applied to the STT-MRAM cell 814, and the current is spin-polarized by the fixed region of the cell core 802 and exerts a torque on the free region of the cell core 802, which switches the magnetization of the free region to "write to" or "program" the STT-MRAM cell 814. In a read operation of the STT-MRAM cell 814, a current is used to detect the resistance state of the cell core 802.

To initiate programming of the STT-MRAM cell 814, the read/write circuitry 807 may generate a write current (i.e., a programming current) to the data/sense line 804 and the source line 806. The polarity of the voltage between the data/sense line 804 and the source line 806 determines the switch in magnetic orientation of the free region in the cell core 802. By changing the magnetic orientation of the free region with the spin polarity, the free region is magnetized according to the spin polarity of the programming current, the programmed logic state is written to the STT-MRAM cell 814.

To read the STT-MRAM cell 814, the read/write circuitry 807 generates a read voltage to the data/sense line 804 and the source line 806 through the cell core 802 and the access transistor 803. The programmed state of the STT-MRAM cell 814 relates to the electrical resistance across the cell core 802, which may be determined by the voltage difference between the data/sense line 804 and the source line 806. In some embodiments, the voltage difference may be compared to the bit line reference 808 and amplified by the sense amplifier 809.

FIG. 8 illustrates one example of an operable STT-MRAM system 800. It is contemplated, however, that the magnetic cell cores (e.g., the magnetic cell core 101A (FIG. 1A), the magnetic cell core 101B (FIG. 1B), the magnetic cell core 201 (FIG. 2C), and the magnetic cell core 401 (FIG. 4)) may be incorporated and utilized within any STT-MRAM system configured to incorporate a magnetic cell core having magnetic regions.

Accordingly, disclosed is a spin torque transfer magnetic random access memory (STT-MRAM) system comprising STT-MRAM cells. At least one STT-MRAM cell of the STT-MRAM cells comprises a magnetic cell core. The magnetic cell core comprises a seed region over a substrate and a nonmagnetic region on the seed region. The seed region comprises at least one of cobalt, iron, and boron. A magnetic region is disposed on the nonmagnetic region and has a switchable magnetic orientation. Another nonmagnetic region is disposed on the magnetic region. Another magnetic region is disposed on the another nonmagnetic region. The at least one STT-MRAM cell also comprises conductive materials in operable communication with the magnetic cell core. The STT-MRAM system also comprises at least one peripheral device in operable communication with the at least one STT-MRAM cell. At least one of an access transistor, a bit line, a word line, and a source line is in operable communication with the magnetic cell core.

Figure 9:
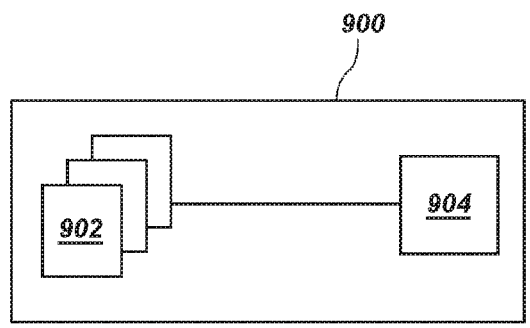
FIG. 9 is a simplified block diagram of a semiconductor device structure including memory cells having a magnetic cell structure according to an embodiment of the present disclosure.

With reference to FIG. 9, illustrated is a simplified block diagram of a semiconductor device 900 implemented according to one or more embodiments described herein. The semiconductor device 900 includes a memory array 902 and a control logic component 904. The memory array 902 may include a plurality of the STT-MRAM cells 814 (FIG. 8) including any of the magnetic cell cores (e.g., the magnetic cell core 101A (FIG. 1A), the magnetic cell core 101B (FIG. 1B), the magnetic cell core 201 (FIG. 2C), and the magnetic cell core 401 (FIG. 4)) discussed above, which magnetic cell cores (e.g., the magnetic cell core 101A (FIG. 1A), the magnetic cell core 101B (FIG. 1B), the magnetic cell core 201 (FIG. 2C), and the magnetic cell core 401 (FIG.

4)) may have been formed according to a method described above and may be operated according to a method described above. The control logic component 904 may be configured to operatively interact with the memory array 902 to read from or write to any or all memory cells (e.g., STT-MRAM cell 814 (FIG. 8)) within the memory array 902.

Accordingly, disclosed is a semiconductor device comprising a spin torque transfer magnetic random access memory (STT-MRAM) array comprising STT-MRAM cells. At least one STT-MRAM cell of the STT-MRAM cells comprises a magnetic cell core. The magnetic cell core comprises a seed region over a substrate and a nonmagnetic region over the seed region. The nonmagnetic region has a bcc (001) crystalline structure. A free region is disposed over the nonmagnetic region. Another nonmagnetic region is disposed over the free region. A fixed region is disposed over the another nonmagnetic region.

Figure 10:
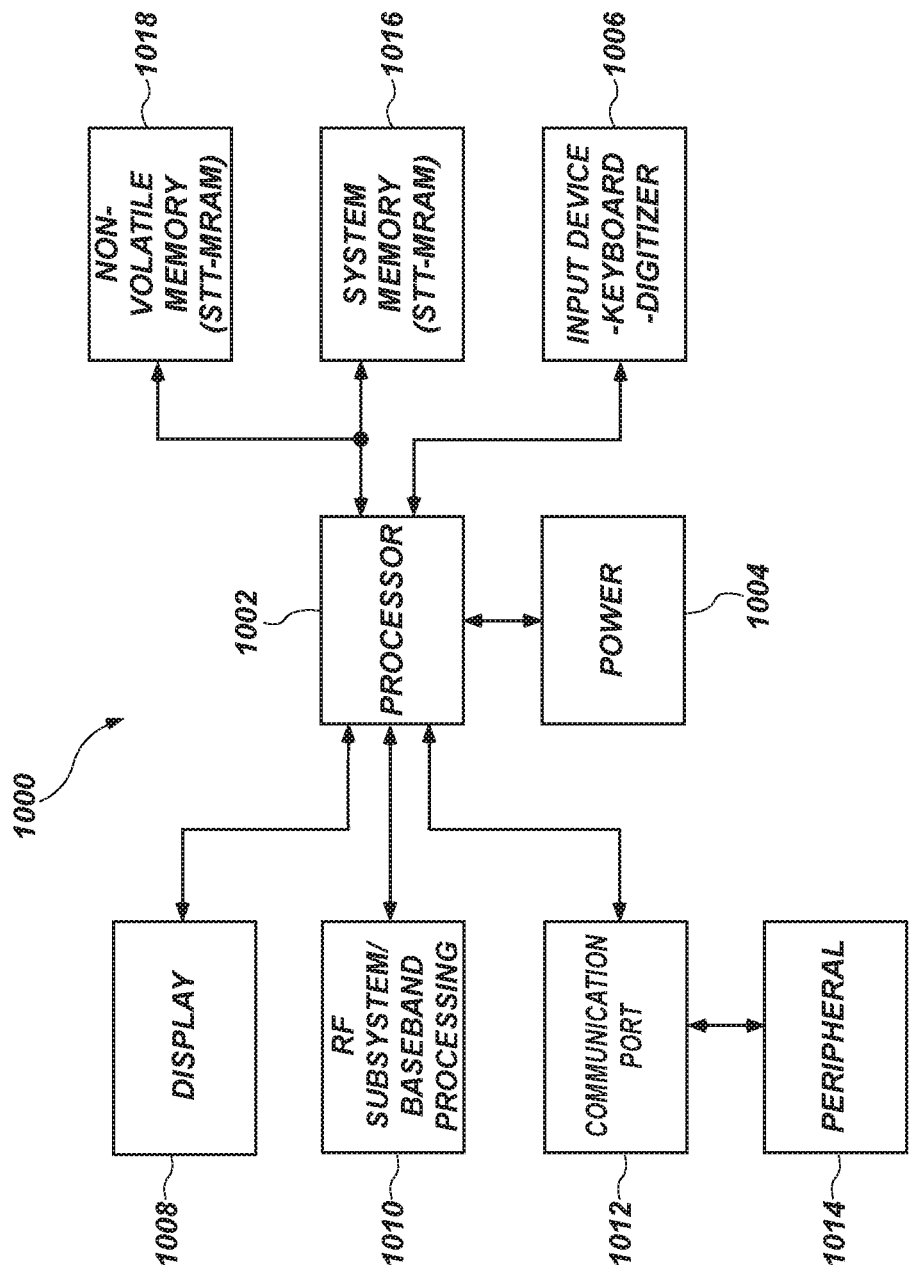
FIG. 10 is a simplified block diagram of a system implemented according to one or more embodiments of the present disclosure.

With reference to FIG. 10, depicted is a processor-based system 1000. The processor-based system 1000 may include various electronic devices manufactured in accordance with embodiments of the present disclosure. The processor-based system 1000 may be any of a variety of types, such as a computer, pager, cellular phone, personal organizer, control circuit, or other electronic device. The processor-based system 1000 may include one or more processors 1002, such as a microprocessor, to control the processing of system functions and requests in the processor-based system 1000. The processor 1002 and other subcomponents of the processor-based system 1000 may include magnetic memory devices manufactured in accordance with embodiments of the present disclosure.

The processor-based system 1000 may include a power supply 1004 in operable communication with the processor 1002. For example, if the processor-based system 1000 is a portable system, the power supply 1004 may include one or more of a fuel cell, a power scavenging device, permanent batteries, replaceable batteries, and rechargeable batteries. The power supply 1004 may also include an AC adapter; therefore, the processor-based system 1000 may be plugged into a wall outlet, for example. The power supply 1004 may also include a DC adapter such that the processor-based system 1000 may be plugged into a vehicle cigarette lighter or a vehicle power port, for example.

Various other devices may be coupled to the processor 1002 depending on the functions that the processor-based system 1000 performs. For example, a user interface 1006 may be coupled to the processor 1002. The user interface 1006 may include input devices such as buttons, switches, a keyboard, a light pen, a mouse, a digitizer and stylus, a touch screen, a voice recognition system, a microphone, or a combination thereof. A display 1008 may also be coupled to the processor 1002. The display 1008 may include an LCD display, an SED display, a CRT display, a DLP display, a plasma display, an OLED display, an LED display, a three-dimensional projection, an audio display, or a combination thereof. Furthermore, an RF sub-system/baseband processor 1010 may also be coupled to the processor 1002. The RF sub-system/baseband processor 1010 may include an antenna that is coupled to an RF receiver and to an RF transmitter (not shown). A communication port 1012, or more than one communication port 1012, may also be coupled to the processor 1002. The communication port 1012 may be adapted to be coupled to one or more peripheral devices 1014, such as a modem, a printer, a computer, a scanner, or a camera, or to a network, such as a local area network, remote area network, intranet, or the Internet, for example.

The processor 1002 may control the processor-based system 1000 by implementing software programs stored in the memory. The software programs may include an operating system, database software, drafting software, word processing software, media editing software, or media playing software, for example. The memory is operably coupled to the processor 1002 to store and facilitate execution of various programs. For example, the processor 1002 may be coupled to system memory 1016, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1016 may include volatile memory, non-volatile memory, or a combination thereof. The system memory 1016 is typically large so that it can store dynamically loaded applications and data. In some embodiments, the system memory 1016 may include semiconductor devices, such as the semiconductor device 900 of FIG. 9, memory cells including any of the magnetic cell cores (e.g., the magnetic cell core 101A (FIG. 1A), the magnetic cell core 101B (FIG. 1B), the magnetic cell core 201 (FIG. 2C), and the magnetic cell core 401 (FIG. 4)), or a combination thereof.

The processor 1002 may also be coupled to non-volatile memory 1018, which is not to suggest that system memory 1016 is necessarily volatile. The non-volatile memory 1018 may include one or more of STT-MRAM, MRAM, read-only memory (ROM) such as an EPROM, resistive read-only memory (RROM), and Flash memory to be used in conjunction with the system memory 1016. The size of the non-volatile memory 1018 is typically selected to be just large enough to store any necessary operating system, application programs, and fixed data. Additionally, the non-volatile memory 1018 may include high capacity memory, such as disk drive memory, such as a hybrid-drive including resistive memory, or other types of non-volatile solid-state memory, for example. The non-volatile memory 1018 may include semiconductor devices, such as the semiconductor device 900 of FIG. 9, memory cells including any of the magnetic cell cores (e.g., the magnetic cell core 101A (FIG. 1A), the magnetic cell core 101B (FIG. 1B), the magnetic cell core 201 (FIG. 2C), and the magnetic cell core 401 (FIG. 4)), or a combination thereof.

Accordingly, disclosed is an electronic system comprising at least one processor. The at least one processor comprises at least one magnetic memory cell. The at least one magnetic memory cell comprises at least two magnetic regions over a seed region comprising at least one of cobalt, iron, and boron. One of the at least two magnetic regions exhibits a switchable magnetic orientation. A nonmagnetic region is between the at least two magnetic regions. Another nonmagnetic region is over the at least two magnetic regions. The electronic system also comprises a power supply in operable communication with the at least one processor.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device comprising at least one magnetic memory cell, the at least one magnetic memory cell comprising:
a magnetic cell core between a lower electrode and an upper electrode, the magnetic cell core comprising:
a seed region directly over the lower electrode, the seed region comprising at least one of cobalt, iron, or boron;
a nonmagnetic oxide region directly over the seed region;
a magnetic region over the nonmagnetic oxide region and comprising a magnetic material exhibiting a switchable magnetic orientation;
another nonmagnetic oxide region over the magnetic region; and
another magnetic region over the another nonmagnetic oxide region.

2. The semiconductor device of claim 1, wherein the seed region exhibits magnetism.

3. The semiconductor device of claim 2, wherein the seed region and the another magnetic region are symmetrically disposed around the magnetic region.

4. The semiconductor device of claim 3, wherein the seed region exhibits a magnetic orientation oppositely directed to a magnetic orientation exhibited by the another magnetic region.

5. The semiconductor device of claim 1, wherein:
the seed region exhibits a horizontal magnetic orientation; and
the magnetic region exhibits a vertical and switchable magnetic orientation.

6. The semiconductor device of claim 1, wherein the seed region defines a vertical thickness less than a vertical thickness defined by the magnetic region.

7. A semiconductor device, comprising:
an array of magnetic memory cells, at least one magnetic memory cell of the array comprising a magnetic cell core comprising:
a seed region comprising at least one of cobalt, iron, or boron;
a free region exhibiting a switchable magnetic orientation;
a fixed region exhibiting a fixed magnetic orientation; and
nonmagnetic oxide regions, the nonmagnetic oxide regions comprising:
a tunnel region directly between the free region and the fixed region; and
a lower nonmagnetic region directly between the free region and the seed region,
the seed region disposed, in the magnetic cell core, below all of the nonmagnetic oxide regions.

8. The semiconductor device of claim 7, further comprising:
an upper electrode above the magnetic cell core;
a lower electrode below the magnetic cell core; and
a lower intermediary region between the seed region and the lower electrode.

9. The semiconductor device of claim 8, wherein the lower intermediary region comprises at least one of tantalum (Ta), titanium (Ti), tantalum nitride (TaN), titanium nitride (TiN), ruthenium (Ru), or tungsten (W).

10. The semiconductor device of claim 7, wherein:
the seed region defines a vertical height of six angstroms (0.6 nm); and
the free region defines a vertical height of fourteen angstroms (1.4 nm).

11. The semiconductor device of claim 7, wherein the lower nonmagnetic region defines a lesser vertical height than the tunnel region.

12. A method of forming a magnetic memory cell, comprising:
forming a precursor structure, comprising:
forming a seed material directly over a lower electrode on a substrate, the seed material comprising at least one of cobalt, iron, or boron;
forming a nonmagnetic oxide material directly over the seed material;
forming a magnetic material over the nonmagnetic oxide material, the magnetic material exhibiting a switchable magnetic orientation;
forming another nonmagnetic oxide material over the magnetic material; and
forming another magnetic material over the another nonmagnetic oxide material; and
patterning the precursor structure to form a seed region from the seed material, a lower nonmagnetic oxide region from the nonmagnetic oxide material, a free region from the magnetic material, a tunnel region from the another nonmagnetic oxide material, and a fixed region from the another magnetic material.

13. The method of claim 12, wherein forming a seed material comprises forming a material consisting essentially of cobalt, iron, and boron.

14. The method of claim 12, wherein forming a seed material comprises forming an amorphous seed material.

15. The method of claim 12, wherein forming a nonmagnetic oxide material comprises forming an amorphous nonmagnetic oxide material.

16. The method of claim 12, further comprising:
annealing the seed material, the nonmagnetic oxide material, the magnetic material, the another nonmagnetic oxide material, and the another magnetic material; and
after the annealing, forming additional magnetic material over the another magnetic material.

17. The method of claim 12, further comprising, before forming the magnetic material over the nonmagnetic oxide material, annealing the seed material and the nonmagnetic oxide material.

18. The method of claim 12, further comprising, before forming the magnetic material, forming a conductive material on or in the nonmagnetic oxide material.

19. The method of claim 18, wherein forming a conductive material comprises forming an atomic monolayer of the conductive material.

20. The method of claim 18, wherein forming a conductive material comprises forming ruthenium (Ru) or an alloy of ruthenium (Ru).

* * * * *

UNITED STATES PATENT AND TRADEMARK OFFICE
CERTIFICATE OF CORRECTION

PATENT NO. : 9,876,053 B2
APPLICATION NO. : 15/289610
DATED : January 23, 2018
INVENTOR(S) : Witold Kula, Wayne I. Kinney and Gurtej S. Sandhu Page 1 of 1

It is certified that error appears in the above-identified patent and that said Letters Patent is hereby corrected as shown below:

In the Specification

| | | |
|---|---|---|
| Column 1, | Line 10, | change "Oct. 11, 2016 the" to --Oct. 11, 2016, the-- |
| Column 1, | Line 65, | change "density (Jr) of the" to --density (Jc) of the-- |
| Column 5, | Line 17, | change "silicon-on-insulator ("SOT")" to --silicon-on-insulator ("SOI")-- |
| Column 10, | Line 5, | change "(e.g., CoFeB, wherein" to --(e.g., $Co_xFe_yB_z$, wherein-- |
| Column 12, | Line 57, | change "materials, LiO materials," to --materials, $L_1 0$ materials,-- |

Signed and Sealed this
Twentieth Day of February, 2018

Andrei Iancu
*Director of the United States Patent and Trademark Office*